(12) United States Patent
Campardo et al.

(10) Patent No.: US 7,168,016 B2
(45) Date of Patent: Jan. 23, 2007

(54) METHOD AND A DEVICE FOR TESTING ELECTRONIC MEMORY DEVICES

(75) Inventors: Giovanni Campardo, Bergamo (IT); Stefano Commodaro, Cassina de' Pecchi (IT); Massimiliano Picca, Muggio' (IT); Patrizia Mongelli, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 907 days.

(21) Appl. No.: 09/823,926

(22) Filed: Mar. 30, 2001

(65) Prior Publication Data

US 2002/0018376 A1 Feb. 14, 2002

(30) Foreign Application Priority Data

Mar. 31, 2000 (IT) .......................... MI2000A0687

(51) Int. Cl.
  *G11C 29/00* (2006.01)
(52) U.S. Cl. .................. 714/718; 714/741; 714/724
(58) Field of Classification Search ................. 714/718
  See application file for complete search history.

(56) References Cited

U.S. PATENT DOCUMENTS 4,450,559 A * 5/1984 Bond et al. .................. 371/10
5,566,386 A * 10/1996 Kumakura et al. ......... 365/226
5,732,033 A * 3/1998 Mullarkey et al. .......... 365/201

OTHER PUBLICATIONS

Russ et al. 'Non-intrusive built-in self-test for FPGA and MCM applications;'IEEE; pp. 480-485; Aug. 8-10, 1995.*
NN74091034: "Circuit Diagnosis and Design Analysis System; IBM Tech. Discl. Bulletin, Jul. 1987, US, vol. 17 ISSUE: 4 1034-1036 ; Sep. 1, 1974".*
NN74091034: "Circuit Diagnosis and Design Analysis System; IBM Tech. Discl. Bulletin, Jul. 1987, US, vol. 17 Issue: 4; Sep. 1, 1974," 3 pages.

* cited by examiner

*Primary Examiner*—Guy J. Lamarre
(74) *Attorney, Agent, or Firm*—Lisa K. Jorgenson; Harold H. Bennett, II; Seed IP Law Group PLCC

(57) ABSTRACT

A method and control device is used for testing electronic memory devices. The method comprises loading test data and/or instructions into a control logic circuit portion associated with a matrix array of memory cells and integrated storage circuitry. According to the invention, a test operation control device is used temporarily instead of the control logic, the test operation control device being external of and connected detachably to the memory device. Advantageously, the test operation control device is a matrix cell array external of the memory.

26 Claims, 1 Drawing Sheet

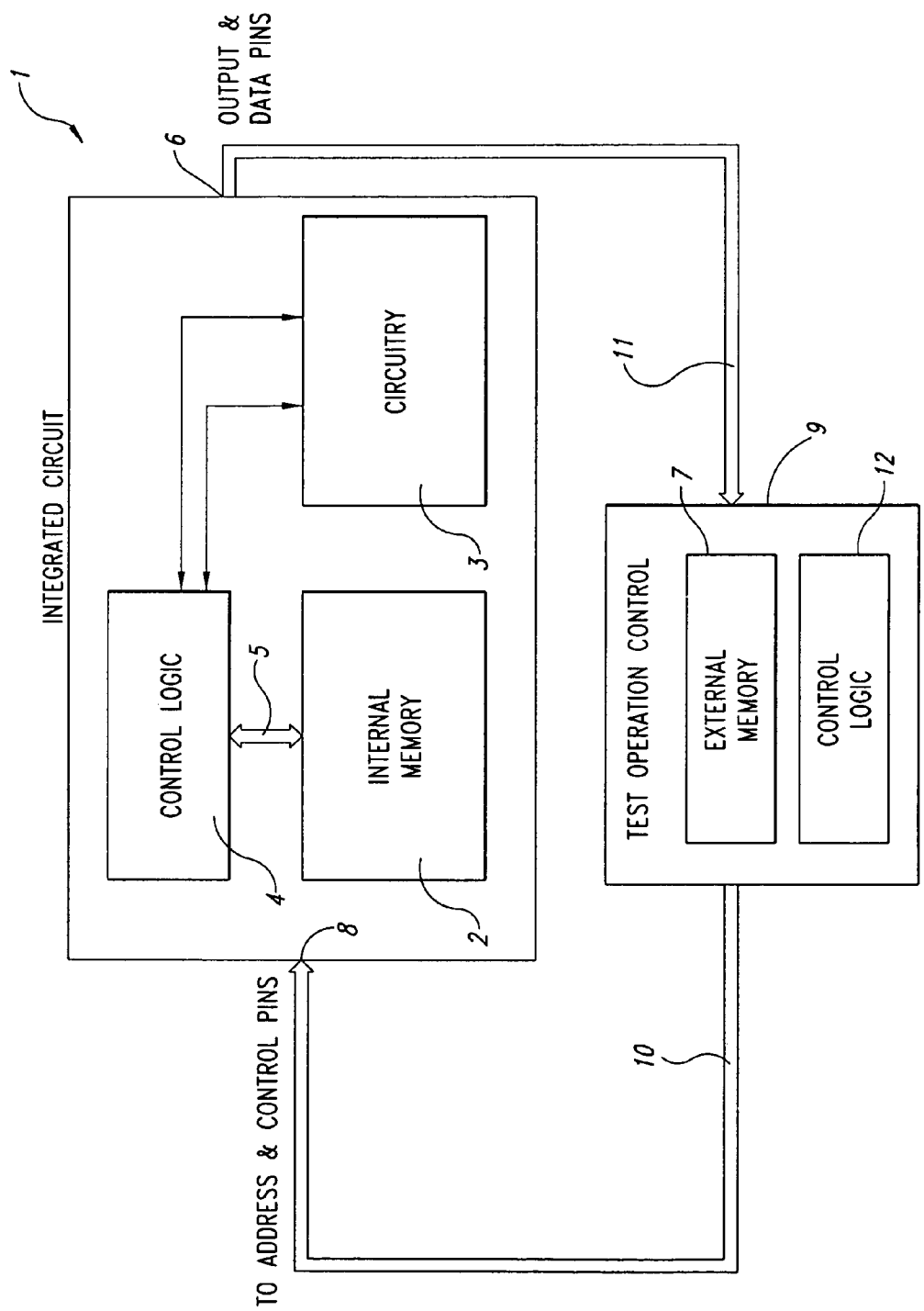
Figure

METHOD AND A DEVICE FOR TESTING ELECTRONIC MEMORY DEVICES

TECHNICAL FIELD

This invention relates to a method of testing electronic memory devices. The invention also concerns a control device implementing the inventive method.

BACKGROUND OF THE INVENTION

As is well known, a prominent feature of electronic non-volatile memory devices, e.g., last-generation flash memory devices, is that a control logic circuit portion is incorporated in them to form an integral part the device. The control logic is not of inconsiderable complexity and importance being, as it is, requisite for executing program and erase algorithms.

The control logic circuit portion may be provided in different forms, such as any of those listed here below.

1. A wired logic, wherein the sequence of the functions to be performed is implemented by a network purely of logic gates. Understandably, in the event of modifications occurring in the instruction flow as a result of design alterations or changed technological requirements, the logic circuit portion must be entirely redesigned.

2. A finite state machine, consisting essentially of either a Moore's or a Mealey's machine the combinational portion whereof is provided by a PLA (Programmable Logic Array) logic structure. In the event of modifications being made, it suffices that the PLA logic structure be reprogrammed, for example by changing a limited number of masks, to implement a new function. In this case, the overall circuit design would be retained, to the benefit of modification and simulation times and cost of the operation.

3. A microprogrammed unit, which contains an instruction algorithm in a memory array. The instructions are carried out by a sequencer which is identical with those provided in microcontrollers and microprocessors. The algorithm-storing memory array may be any non-volatile memory, e.g., a ROM, in which case reprogramming will entail modifications to some masks, a PROM, EPROM, EEPROM, or flash-type memory, in which case reprogramming may be software based.

Additionally to executing user's algorithms, the control logic is used:

- at the characterizing stage, to check all the logic and analog parts for full operability by emulating the user-mode operation to be, or measuring such characteristic parameters as the value attained by voltage boosters, if provided, or the value of the internally generated reference voltage.
- at the EWS (Electrical Wafer Test) or final test stage, to perform all those operations that will make the memory ready for use by the ultimate customer, such as reference cell writing, setting up special UPROM or OTP registers, etc.

It will be appreciated from the foregoing that the control logic circuit portion exacts careful designing, not only on account of its complex structure but also, and above all, of the need to have the operability of its many functions thoroughly checked. Incomplete coverage of all its operational aspects, and consequent circuit malfunctions, would require corrective actions which are specific to the type of the implementation used.

Wired logic-based approaches apparently admit of no corrective action.

Approaches based on a finite-state machine or a microprogrammed unit do admit of reprogramming, with greater or lesser degrees of difficulty. In all cases, however, the memory device must be tested before full operability of the control logic can be ascertained.

To test the control logic for its operability, techniques known as DFT (Design For Testability) are usually resorted to. These techniques consist of using special sequences or chains of storage components, e.g., latches and/or flip-flops, having a load input and an output for cascade connection to the next component in the chain. In the test mode, these "test chains" are loaded with predetermined data sequences as if they were single serial registers. Briefly, the control logic incorporates a hardware portion specially for performing test operations.

In response to forcing said data sequence, the control logic provides something of a "reaction to stimulus", and a record of the data sequences and their responses, when compared with expected results provided by a simulation, will allow conformity of the circuit with the specifications to be verified and guaranteed. A drawback with the above testing method is that complex gates must be included in the design of the control logic portion devoted to testing, which expands the area requirements of the device to a considerable extent.

A commonly adopted solution consists of testing only the analog circuitry, and is followed by characterization. Where the operability of the various parts of the control logic are to be tested in situations other than those provided for by the algorithm, a certain number of test registers are included which are effective to drive the analog circuits, once suitably loaded. Again, the overall area for occupation by the circuit must be expanded, merely to enable the testing operations to be performed.

The technical problem underlying this invention is to provide a method of testing integrated memory devices with features appropriate to allow plural testing operations to be carried out, while avoiding the need for the circuit under test to incorporate dedicated circuit portions merely to enable such operations to be performed.

SUMMARY OF THE INVENTION

The principle on which this invention stands is that of having an external programmable control logic, detachably connected to the memory device, temporarily used instead of the resident control logic.

Based on this principle, the technical problem is solved by a testing method as previously indicated wherein it comprises temporarily using a test operation control device for said control logic, which test operation control device is external of and connected detachably to the memory device.

The invention also relates to a control device for use in testing electronic memory devices provided with a matrix array of memory cells and a control logic circuit portion associated with the memory cell array, as well as with circuitry associated with said control logic, wherein it comprises a memory unit external to the control logic.

The features and advantages of the method and the device according to this invention will be apparent from the following description of embodiments thereof, given by way of non-limitative examples with reference to the accompanying drawing.

In the drawing:

BRIEF DESCRIPTION OF THE DRAWING

The one FIGURE shows schematically an electronic memory device as associated with a testing device embodying this invention.

DETAILED DESCRIPTION OF THE INVENTION

With reference to the drawing FIGURE, an electronic memory device, preferably of the semiconductor integrated type, is generally shown at 1 in schematic form.

This memory device 1 may be a non-volatile memory, e.g., a PROM, EPROM, EEPROM, or flash EPROM. However, it would be possible for this memory to be a volatile memory.

The memory device 1 comprises a matrix array 2 of non-volatile memory cells, and associated circuitry 3. The memory device 1 further comprises a control logic circuit portion 4 which is two-way connected to the array 2 by an internal bus 5. The control logic 4 is two-way connected to the circuitry 3 as well.

Advantageously in this invention, a test operation control device 9 is associated temporarily with the memory device 1 by detachable connection to the memory device 1.

More particularly, the control device 9 may be an external memory array 7, e.g., of the non-volatile type, substantially like that incorporated in the device 1. In another embodiment, the control device 9 may be a control logic 12 substantially like that incorporated in the device 1.

The detachable connection between the test operation control device 9 and the memory device 1 is established, using data input/output pins 6 along with address and control signal input pins 8, over respective connection buses 11 and 10.

It is through these pins 6, 8 and buses 11, 10, that the control device 9 is temporarily two-way connected to the control logic 4 of the memory 1.

The invention proceeds from the consideration that a control logic unit 4 already is included in the memory device 1 and operative, for the purposes of the user's algorithms, to control all the other circuit portions of the memory 1 by an appropriate algorithm.

The solution to the problem resides in temporarily "replacing" the cell array 2 with another array 7, external of the device 1, Which is one example of, or a portion of the test operation control device 7, as shown in the drawing. According to the principles of the invention the external array 7 is used to simulate the internal memory 2, making possible the direct test and observation of the interaction of the control logic 4 with the array 7. The external memory array 7 can be an actual hardware memory, identical to the internal memory array 2. Alternatively, it may be a simulated array, having some portions in hardware and some in software, or all portions in software, to simulate the relevant portions and operations of the internal memory array 2. As will be appreciated, the test operation control device 9 may also comprise logic circuitry 12 to simulate the control logic 4, for the purpose of testing and observing the memory array 2 directly, and in isolation from the control logic.

Thus, the invention is advantageous especially in that it allows the control algorithm of circuit portions of the memory device 1 to be changed in order to carry out a series of different tests. This not only allows the circuit portions of the device 1 to be controlled as desired, but also the control logic 4 itself to be isolated and tested for operability in a self-diagnosis mode.

These are not features that a conventional microprogrammed unit can possibly offer, because its code-storing array would be substantially unchangeable unless masks are changed, where ROMs are involved, or the contents is altered, where flash memories are involved. Also, any alterations would take a long time to check the operation for its effectiveness.

Where a test program is to be run instead of the standard one, the method of this invention provides for the control logic 4 to read from the external memory rather than from the internal array 2. The input/output pins of the device 1 can be utilized for the purpose.

For example, the address of the external memory 7 (i.e., the program counter) can be supplied through the data pins 6, while through the address pins 8, the external memory 7 will supply the internal logic with an instruction for decodification and execution by it.

The test procedure can be controlled using any combinations of control or address signals (CE, WE, addresses and/or data not involved in the above loop, etc.).

With the method of this invention, debugging time can be improved, at the same time as the algorithms used in the memory device are optimized. The algorithms of today's multi-level flash memories are highly complicated (450-minterm PLA), and written in hardware format.

Upon the memory device leaving the production lines, the above algorithms are run with a considerable expenditure of effort by the person in charge of the debugging operations.

Although the program memory is resident in the memory device 1, this invention allows it to be bypassed, and a faster analysis of the whole device performed.

The method and device of this invention do solve the technical problem and offer a number of advantages, as specified here below.

Testing the various parts of the device can be made flexible for no added complexity and area requirements. A multiplexer and an identification protocol may be used, if desired, for a command to "substitute".

At the initial stage (EWS and Final Test) of characterizing the memory device, the algorithm flow can be altered at will, and an optimum solution found with no need for expensive hardware modifications.

The operability of the control logic can be tested per se.

The operability of (analog, matrix, etc.) circuits usually utilized by the above logic in the user mode can be likewise tested.

A different algorithm from that actually "written" in the PLA or the ROM of the microprogrammed unit may be implemented merely for testing purposes, without altering its contents.

In the light of the foregoing, changes and modifications may be made unto the method and the device of this invention by a skilled person in the art, still within the scope of the following claims.

The invention claimed is:

1. A method of testing an electronic memory device that includes a control logic circuit portion, a matrix array of memory cells, and storage circuitry integrated together on a semiconductor substrate, the method comprising:

loading test data and/or instructions into the control logic circuit portion using a test operation control device, temporarily, said test operation control device being external of, and temporarily connected to, said memory device, said test operation control device having a matrix cell array external to the memory device; and testing the logic circuit portion of the memory device by using the external matrix cell array to simulate the matrix array of memory cells of the memory device.

2. A method according to claim 1 further comprising temporarily connecting the test operation control device to said memory device through data pins and address pins of the memory device, as well as over respective connecting buses.

3. A method according to claim 1 wherein said memory array is a non-volatile memory array.

4. A method of testing an electronic memory device that includes a control logic circuit portion, a matrix array of memory cells, and storage circuitry integrated together on a semiconductor substrate, the method comprising:
   loading test data and/or instructions into the control logic circuit portion using a test operation control device, temporarily, said test operation control device being external of, and temporarily connected to, said memory device, said test operation control device having a control logic external to the memory device; and
   testing the matrix array of the memory device by simulating the control logic circuit portion of the memory device using the external control logic.

5. A method according to claim 4 further comprising temporarily connecting the test operation control device to said memory device through data pins and address pins of the memory device, as well as over respective connecting buses.

6. A method according to claim 4 wherein said memory array is a non-volatile memory array.

7. A control device for testing an electronic memory device formed on a semiconductor substrate, the memory device having a matrix array of memory cells and a control logic circuit portion associated with the memory cell array, as well as circuitry associated with said control logic, the control device comprising:
   a memory unit external of and detachably connectable to the memory device, the memory unit configured to simulate the memory cell array during testing of the control logic circuit portion of the memory device.

8. A device according to claim 7, wherein the detachable connection is established through data pins and address pins of the memory device.

9. A device according to claim 7, wherein said external memory unit is a non-volatile type.

10. A device comprising:
    an internal memory array integrated onto a semiconductor substrate;
    a control logic circuit integrated onto the semiconductor substrate; and
    a test control device, external to the semiconductor substrate, having a circuit for simulating the internal memory array to permit testing of the control logic circuit in isolation from the internal memory array.

11. The device of claim 10, wherein the test control device includes a circuit for simulating the control logic circuit, the test control device being detachably connectable to the semiconductor substrate.

12. The device of claim 11, wherein the circuit for simulating the internal memory array and the circuit for simulating the control logic circuit are integrated into one test device.

13. The device of claim 10, wherein the circuit for simulating the internal memory array is an external memory array.

14. The device of claim 10, wherein the circuit for simulating the internal memory array comprises a software program in an external memory executed by a testing circuit.

15. A method for testing a memory device having a memory array and a control logic circuit integrated onto a semiconductor substrate, comprising:
    connecting an external circuit to the memory device;
    performing test operations with the memory array and the external connected circuit, using the external connected circuit to simulate the control logic circuit; and
    observing interactions between the memory array and the external connected circuit.

16. The method of claim 15, further comprising changing control algorithms of circuits integrated onto the semiconductor substrate to couple the external connected circuit with the memory array.

17. A method for testing a memory device having a control logic circuit and a memory array integrated onto a semiconductor substrate, comprising:
    connecting an external circuit to the memory device;
    performing test operations with the control logic circuit and the external connected circuit, using the external connected circuit to simulate the memory array; and
    observing interactions between the control logic circuit and the external connected circuit.

18. The method of claim 17, further comprising changing control algorithms of circuit portions of the memory to couple the external circuit to the control logic circuit.

19. A device, comprising:
    a semiconductor substrate;
    a memory array formed on the substrate;
    a control logic circuit formed on the substrate and configured to control operation of the memory array under normal operating conditions; and
    bypass circuitry formed on the substrate, and configured to permit substitution of an external memory array configured to simulate the memory array formed on the substrate, for the purpose of testing the control logic circuit separately from the memory array formed on the substrate.

20. The device of claim 19, further comprising bypass circuitry formed on the substrate, and configured to permit substitution of an external control logic circuit configured to simulate the control logic circuit formed on the substrate, for the purpose of testing the memory array, separately from the control logic circuit formed on the substrate.

21. The device of claim 19 wherein the bypass circuitry comprises an instruction set programmed into the control logic circuit.

22. An integrated semiconductor device configured to undergo testing by an external testing device, comprising:
    a non-volatile memory array;
    a control logic circuit configured to selectively program, read, and erase cells of the non-volatile memory array; and
    an instruction set configured to bypass the memory array, such that, when the instruction set is activated, the control logic circuit is configured to program, read, and erase cells of a memory array of the external device, in simulation of the non-volatile memory array.

23. The device of claim 22, further comprising an additional instruction set configured to bypass the control logic circuit, such that, when the additional instruction set is activated, the non-volatile memory array is configured to undergo program, read, and erase operations by a control logic of the external testing device, in simulation of the control logic circuit of the integrated semiconductor device.

24. The device of claim 22, further comprising a plurality of external pins, and wherein the instruction set is configured to be activated by a command signal at one or more of the external pins of the device.

25. An integrated semiconductor device configured to undergo testing by an external testing device, comprising:
    a non-volatile memory array;

a control logic circuit configured to selectively program, read, and erase cells of the non-volatile memory array; and an instruction set configured to bypass the control logic circuit, such that, when the instruction set is activated, the non-volatile memory array is configured to undergo program, read, and erase operations by a control logic of the external testing device, in simulation of the control logic circuit of the integrated semiconductor device.

26. The integrated semiconductor device of claim 25, further comprising an instruction set configured to bypass the memory array, such that, when the instruction set is activated, the control logic circuit is configured to program, read, and erase cells of a memory array of the external device, in simulation of the non-volatile memory array.

* * * * *